(12) United States Patent
Kusakabe

(10) Patent No.: US 6,718,108 B2
(45) Date of Patent: Apr. 6, 2004

(54) SEMICONDUCTOR PHOTODETECTOR

(75) Inventor: Atsuhiko Kusakabe, Tokyo (JP)

(73) Assignee: NEC Compound Semiconductor Devices, Kanagawa (JP)

( * ) Notice: Subject to any disclaimer, the term of this patent is extended or adjusted under 35 U.S.C. 154(b) by 267 days.

(21) Appl. No.: 09/731,696

(22) Filed: Dec. 8, 2000

(65) Prior Publication Data

US 2001/0012432 A1 Aug. 9, 2001

(30) Foreign Application Priority Data

Dec. 10, 1999 (JP) .......................................... 11-351081

(51) Int. Cl.$^7$ ................................................. G02B 6/10
(52) U.S. Cl. ........................................ 385/131; 385/129
(58) Field of Search ................................. 385/131, 129, 385/130, 132

(56) References Cited

U.S. PATENT DOCUMENTS

| | | | | |
|---|---|---|---|---|
| 5,787,106 A | * | 7/1998 | Tabuchi et al. | 372/50 |
| 5,825,047 A | * | 10/1998 | Ajisawa et al. | 257/12 |
| 5,838,854 A | * | 11/1998 | Taneya et al. | 385/50 |
| 5,960,257 A | * | 9/1999 | Ishino et al. | 438/31 |
| 6,232,141 B1 | * | 5/2001 | Kusakabe | 438/57 |
| 6,282,219 B1 | * | 8/2001 | Butler et al. | 372/50 |
| 6,330,265 B1 | * | 12/2001 | Kinoshita | 372/50 |

FOREIGN PATENT DOCUMENTS

| | | |
|---|---|---|
| EP | 0 627 771 A1 | 12/1994 |
| EP | 0 889 529 A1 | 1/1999 |
| JP | 4-241471 | 8/1992 |
| JP | 6-120552 | 4/1994 |
| JP | 10090540 | 4/1998 |

OTHER PUBLICATIONS

M. Zirngibl et al., "High–Speed Photodetectors on InGaAs/GaAs–on–GaAs superlattices," Journal of Applied Physics, V. 69, 1991, pp. 8392–8398.

* cited by examiner

*Primary Examiner*—Frank G. Font
*Assistant Examiner*—Kevin Kianni
(74) *Attorney, Agent, or Firm*—Young & Thompson

(57) ABSTRACT

The present invention provides an optical waveguide structure comprising plural periods of a multi-layered structure which comprises an InGaAs optical absorption layer of a first conductivity type, a pair of first and second InGaAsP cladding layers of the first conductivity type sandwiching the InGaAs optical absorption layer, and a pair of a first InP layer of the first conductivity type and a second InP layer of a second conductivity type, and the first and second InP layers sandwiching the first and second InGaAsP cladding layers.

13 Claims, 3 Drawing Sheets

SEMICONDUCTOR PHOTODETECTOR

BACKGROUND OF THE INVENTION

The present invention relates to a semiconductor photodetector, and more particularly to a semiconductor photodetector exhibiting a high speed response and having a high external quantum efficiency.

FIG. 1 is a fragmentary cross sectional elevation view illustrative of a conventional semiconductor photodetector. The conventional semiconductor photodetector is provided over a semi-insulating InP substrate 20. An n+-InGaAsP layer 21 having a thickness of 0.2 micrometers is selectively formed on a first region of an upper surface of the semi-insulating InP substrate 20. A first polyimide insulating layer 27a is also selectively formed on a second region of the upper surface of the semi-insulating InP substrate 20. A second polyimide insulating layer 27b is selectively formed on a first region of an upper surface of the n+-InGaAsP layer 21. The second polyimide insulating layer 27b has a window through which the upper surface of the n+-InGaAsP layer 21 is shown. An n-contact 28 of AuGaNi is formed in the window and on the upper surface of the n+-InGaAsP layer 21, so that the n-contact 28 is surrounded by the second polyimide insulating layer 27b. A multi-layered structure is provided selectively provided on a second region of the upper surface of the n+-InGaAsP layer 21, so that the multi-layered structure is surrounded by the first and second polyimide insulating layers 27a and 27b. The multi-layered structure comprises the following five layers 22, 23, 24, 25 and 26. An undoped InGaAs optical absorption layer 22 having a thickness of 0.4 micrometers is selectively provided on the second region of the upper surface of the n+-InGaAsP layer 21. A p+-InGaAs optical absorption layer 23 having a thickness of 0.2 micrometers is laminated on the undoped InGaAs optical absorption layer 22. A p+-InGaAsP layer 24 having a thickness of 0.2 micrometers is laminated on the p+-InGaAs optical absorption layer 23. A p+-InP layer 25 having a thickness of 0.5 micrometers is laminated on the p+-InGaAsP layer 24. A p+-InGaAsP layer 26 having a thickness of 0.2 micrometers is laminated on the p+-InP layer 25. An upper surface of the p+-InGaAsP layer 26 is leveled to the top surfaces of the first and second polyimide insulating layers 27a and 27b to form a palatalized surface. A p-contact 29 of AuZnNi is provided on the palatalized surface, wherein the p-contact 29 is in contact with the p+-InGaAsP layer 26. The n-contact 28 and the p-contact 29 are electrically connected to each other through the n+-InGaAsP layer 21, the undoped InGaAs optical absorption layer 22, the p+-InGaAs optical absorption layer 23, the p+-InGaAsP layer 24, the p+-InP layer 25 and the p+-InGaAsP layer 26. The optical waveguide comprises the n+-InGaAsP layer 21, the undoped InGaAs optical absorption layer 22, the p+-InGaAs optical absorption layer 23, the p+-InGaAsP layer 24, the p+-InP layer 25 and the p+-InGaAsP layer 26. The n-contact 28 is bonded through a bonding wire to a pad formed on the top surface of the second polyimide insulating film 27b. The above undoped InGaAs optical absorption layer 22 further comprises three lamination layers of a p--InGaAs layer, an i-InGaAs and a p--InGaAs layer.

In order to realize the high speed response of the conventional semiconductor photodetector, a total thickness of the undoped InGaAs optical absorption layer 22 and the p+-InGaAs optical absorption layer 23 is thin, for example, 0.6 micrometers which is less than 1 micrometer. The reduction in the total thickness of the undoped InGaAs optical absorption layer 22 and the p+-InGaAs optical absorption layer 23 shortens a carrier traveling time to improve the high speed response of the conventional semiconductor photodetector. The reduction in the total thickness of the undoped InGaAs optical absorption layer 22 and the p+-InGaAs optical absorption layer 23, however, raises a problem with a reduction in coupling efficiency to an incident light from an optical fiber. An optical absorption region of the above conventional semiconductor photodetector comprises the n+-InGaAsP layer 21, the undoped InGaAs optical absorption layer 22, the p+-InGaAs optical absorption layer 23 and the p+-InGaAsP layer 24. A total thickness of the n+-InGaAsP layer 21, the undoped InGaAs optical absorption layer 22, the p+-InGaAs optical absorption layer 23 and the p+-InGaAsP layer 24 is 1 micrometer. Namely, the thickness of the optical absorption region of the above conventional semiconductor photodetector is 1 micrometer. A spot size of the incident light from the optical fiber is, however, about 9 micrometers. namely, the thickness of the optical absorption region of the above conventional semiconductor photodetector is much smaller than the spot size of the incident light from the optical fiber, for which reason an external quantum efficiency is low.

In the above circumstances, it had been required to develop a novel semiconductor photodetector free from the above problems.

SUMMARY OF THE INVENTION

Accordingly, it is an object of the present invention to provide a novel semiconductor photodetector free from the above problems.

It is a further object of the present invention to provide a novel semiconductor photodetector exhibiting a high speed response and having a high external quantum efficiency.

It is a still further object of the present invention to provide a novel semiconductor photodetector exhibiting a high speed response at about 20 GHz and having a high external quantum efficiency of not less than 90%.

It is yet a further object of the present invention to provide a novel semiconductor photodetector operable at a low voltage of not more than 1 volt and having a high reliability and a stable dark current characteristic.

The present invention provides an optical waveguide structure comprising plural periods of a multi-layered structure which comprises an InGaAs optical absorption layer of a first conductivity type, a pair of first and second InGaAsP cladding layers of the first conductivity type sandwiching the InGaAs optical absorption layer, and a pair of a first InP layer of the first conductivity type and a second InP layer of a second conductivity type, and the first and second InP layers sandwiching the first and second InGaAsP cladding layers.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
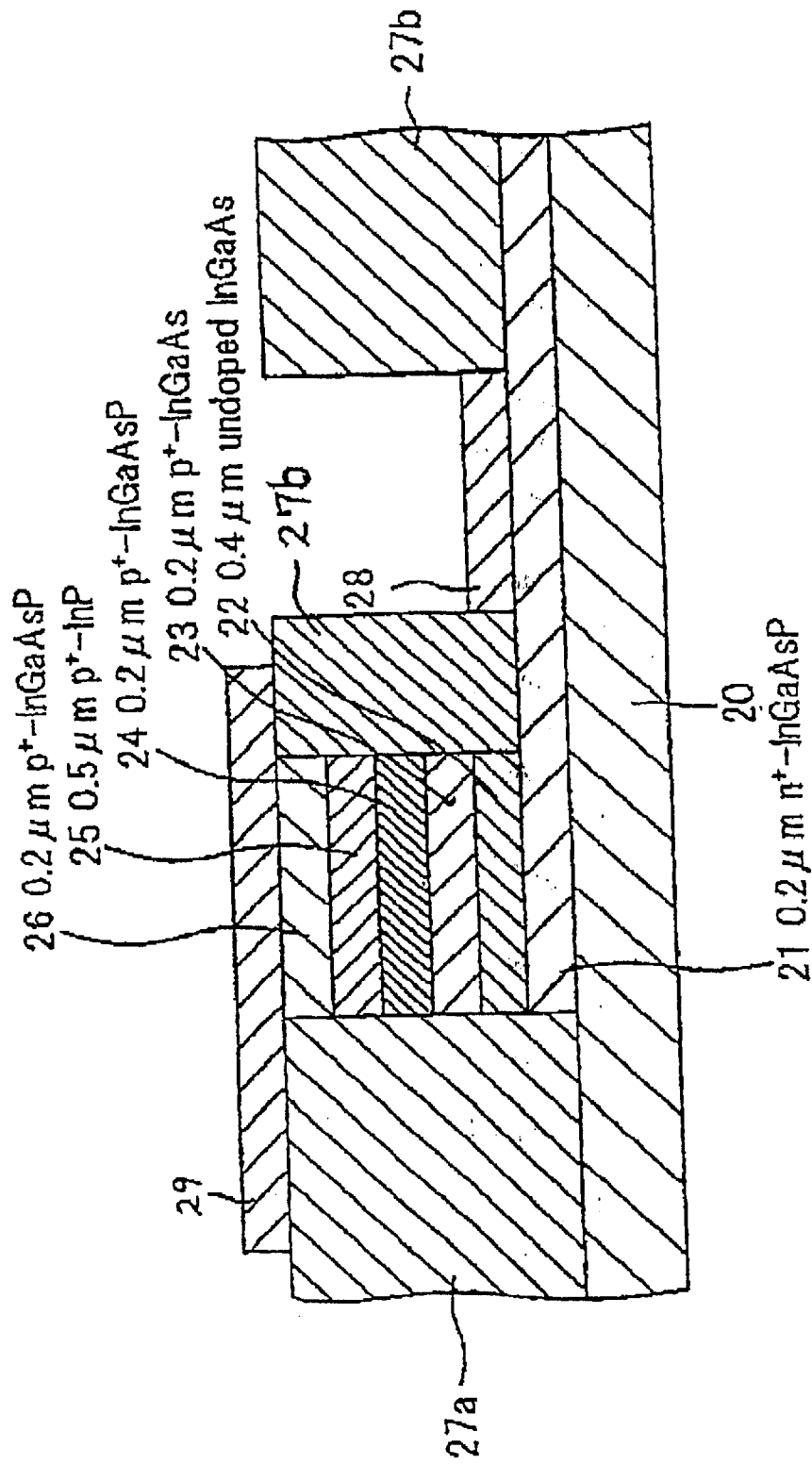
FIG. 1 is a fragmentary cross sectional elevation view illustrative of a conventional semiconductor photodetector.

The first present invention provides an optical waveguide structure comprising plural periods of a multi-layered structure which comprises an InGaAs optical absorption layer of a first conductivity type, a pair of first and second InGaAsP cladding layers of the first conductivity type sandwiching the InGaAs optical absorption layer, and a pair of a first InP layer of the first conductivity type and a second InP layer of a second conductivity type, and the first and second InP layers sandwiching the first and second InGaAsP cladding layers.

The InGaAs optical absorption layer is thin. The InGaAs optical absorption layer has a low impurity concentration. This means that a carrier traveling distance through the low impurity semiconductor region is short. Further, the first and second InP layers sandwich the first and second InGaAsP cladding layers which further sandwich the thin InGaAs optical absorption layer. This sandwich structure allows that application of a low voltage, for example, not higher than 1 volt causes a space charge region in the InGaAs optical absorption layer. The above two characteristics allow the semiconductor photodetector having the above novel structure to exhibit the high speed response.

Moreover, the first and second InP layers sandwich the first and second InGaAsP cladding layers which further sandwich the thin InGaAs optical absorption layer. This sandwich structure enlarges an effective area or an effective thickness of the absorption region of the optical waveguide structure even the carrier traveling distance through the low impurity semiconductor region is short. Further, the paired first and second InGaAsP cladding layers have the same conductivity type. This improves the coupling efficiency to the incident light from the optical fiber.

It is also preferable that the optical waveguide structure has at least a facet coated with an n-InP layer. The n-InP layer protects the p-n junction structure of the above multi-layered structure to ensure a high reliability and a stable dark current characteristic of the semiconductor photodetector.

It is also preferable that the InGaAs optical absorption layer has a thickness in the range of 0.15 micrometers to 0.25 micrometers. The InGaAs optical absorption layer is thin. The InGaAs optical absorption layer has a low impurity concentration. This means that a carrier traveling distance through the low impurity semiconductor region is short. Further, the first and second InP layers sandwich the first and second InGaAsP cladding layers which further sandwich the thin InGaAs optical absorption layer. This sandwich structure allows that application of a low voltage, for example, not higher than 1 volt causes a space charge region in the InGaAs optical absorption layer. The above two characteristics allow the semiconductor photodetector having the above novel structure to exhibit the high speed response.

It is also preferable that the plural periods of the multi-layered structure is in the range of 5–20. This structure enlarges an effective area or an effective thickness of the absorption region of the optical waveguide structure even the carrier traveling distance through the low impurity semiconductor region is short. Further, the paired first and second InGaAsP cladding layers have the same conductivity type. This improves the coupling efficiency to the incident light from the optical fiber.

It is also preferable that each of the first and second InP layers is common to adjacent two of the multi-layered structure.

It is also preferable that the optical waveguide structure includes a sequential laminated structure of an n+-InP layer, an n+-InGaAsP cladding layer, an n--InGaAs optical absorption layer, an n+-InGaAsP cladding layer, a p+-InP layer, an n+-InGaAsP cladding layer, an n--InGaAs optical absorption layer, and an n+-InGaAsP cladding layer.

The novel semiconductor photodetector exhibits a high speed response at about 20 GHz and having a high external quantum efficiency of not less than 90%. The novel semiconductor photodetector is also operable at a low voltage of not more than 1 volt and having a high reliability and a stable dark current characteristic.

The second present invention provides a semiconductor photodetector comprising: a pair of a p-electrode and an n-electrode; a substrate; and an optical waveguide structure electrically connected between the p-electrode and the n-electrode and provided over the substrate, wherein the optical waveguide structure comprises plural periods of a multi-layered structure which comprises an InGaAs optical absorption layer of a first conductivity type, a pair of first and second InGaAsP cladding layers of the first conductivity type sandwiching the InGaAs optical absorption layer, and a pair of a first InP layer of the first conductivity type and a second InP layer of a second conductivity type, and the first and second InP layers sandwiching the first and second InGaAsP cladding layers.

The InGaAs optical absorption layer is thin. The InGaAs optical absorption layer has a low impurity concentration. This means that a carrier traveling distance through the low impurity semiconductor region is short. Further, the first and second InP layers sandwich the first and second InGaAsP cladding layers which further sandwich the thin InGaAs optical absorption layer. This sandwich structure allows that application of a low voltage, for example, not higher than 1 volt causes a space charge region in the InGaAs optical absorption layer. The above two characteristics allow the semiconductor photodetector having the above novel structure to exhibit the high speed response.

Moreover, the first and second InP layers sandwich the first and second InGaAsP cladding layers which further sandwich the thin InGaAs optical absorption layer. This sandwich structure enlarges an effective area or an effective thickness of the absorption region of the optical waveguide structure even the carrier traveling distance through the low impurity semiconductor region is short. Further, the paired first and second InGaAsP cladding layers have the same conductivity type. This improves the coupling efficiency to the incident light from the optical fiber.

It is also preferable that the optical waveguide structure has at least a facet coated with an n-InP layer. The n-InP layer protects the p-n junction structure of the above multi-layered structure to ensure a high reliability and a stable dark current characteristic of the semiconductor photodetector.

It is also preferable that the InGaAs optical absorption layer has a thickness in the range of 0.15 micrometers to 0.25 micrometers. The InGaAs optical absorption layer is thin. The InGaAs optical absorption layer has a low impurity concentration. This means that a carrier traveling distance through the low impurity semiconductor region is short. Further, the first and second InP layers sandwich the first and second InGaAsP cladding layers which further sandwich the thin InGaAs optical absorption layer. This sandwich structure allows that application of a low voltage, for example, not higher than 1 volt causes a space charge region in the InGaAs optical absorption layer. The above two characteristics allow the semiconductor photodetector having the above novel structure to exhibit the high speed response.

It is also preferable that the plural periods of the multi-layered structure is in the range of 5–20. This structure enlarges an effective area or an effective thickness of the absorption region of the optical waveguide structure even the carrier traveling distance through the low impurity semiconductor region is short. Further, the paired first and second InGaAsP cladding layers have the same conductivity type. This improves the coupling efficiency to the incident light from the optical fiber.

It is also preferable that each of the first and second InP layers is common to adjacent two of the multi-layered structure.

It is also preferable that the optical waveguide structure includes a sequential laminated structure of an n+-InP layer, an n+-InGaAsP cladding layer, an n--InGaAs optical absorption layer, an n+-InGaAsP cladding layer, a p+-InP layer, an n+-InGaAsP cladding layer, an n--InGaAs optical absorption layer, and an n+-InGaAsP cladding layer.

The novel semiconductor photodetector exhibits a high speed response at about 20 GHz and having a high external quantum efficiency of not less than 90%. The novel semiconductor photodetector is also operable at a low voltage of not more than 1 volt and having a high reliability and a stable dark current characteristic.

Preferred Embodiment

Figure 2A:
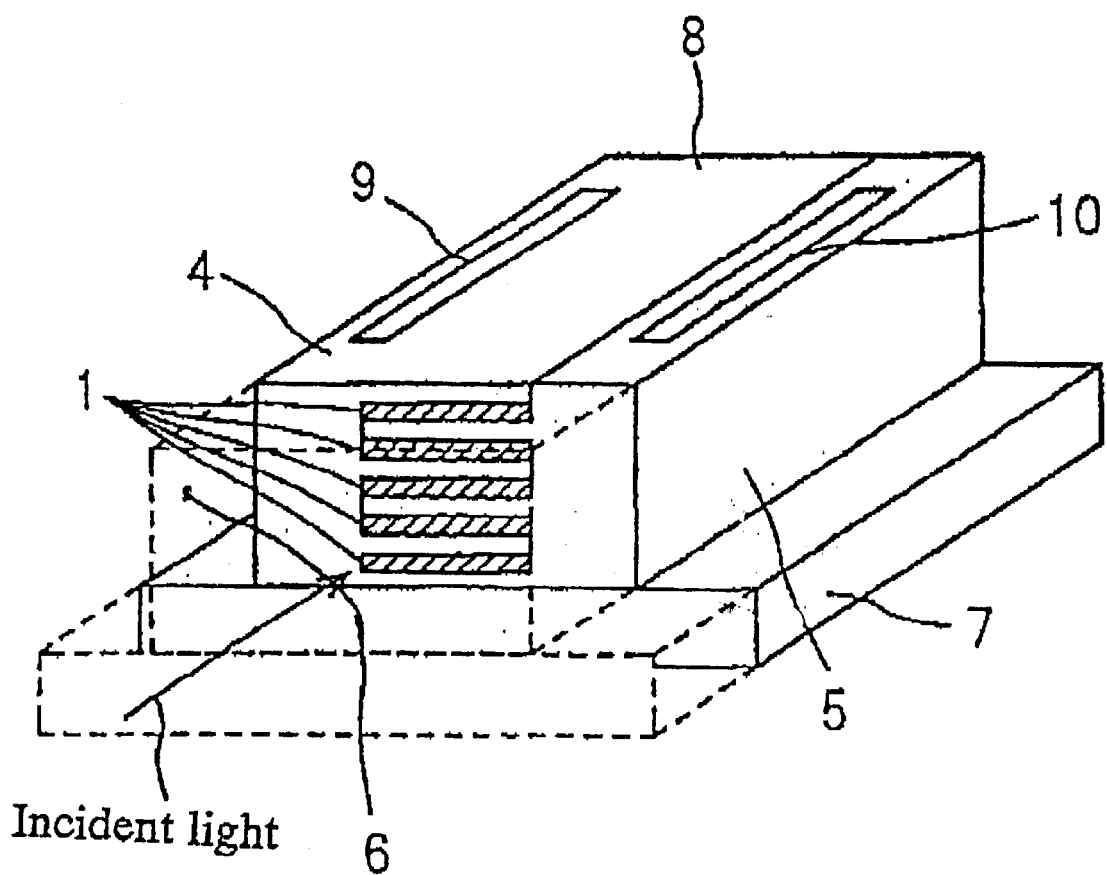
FIG. 2A is a schematic perspective view illustrative of a novel semiconductor photodetector in a first embodiment in accordance with the present invention.
Figure 2B:
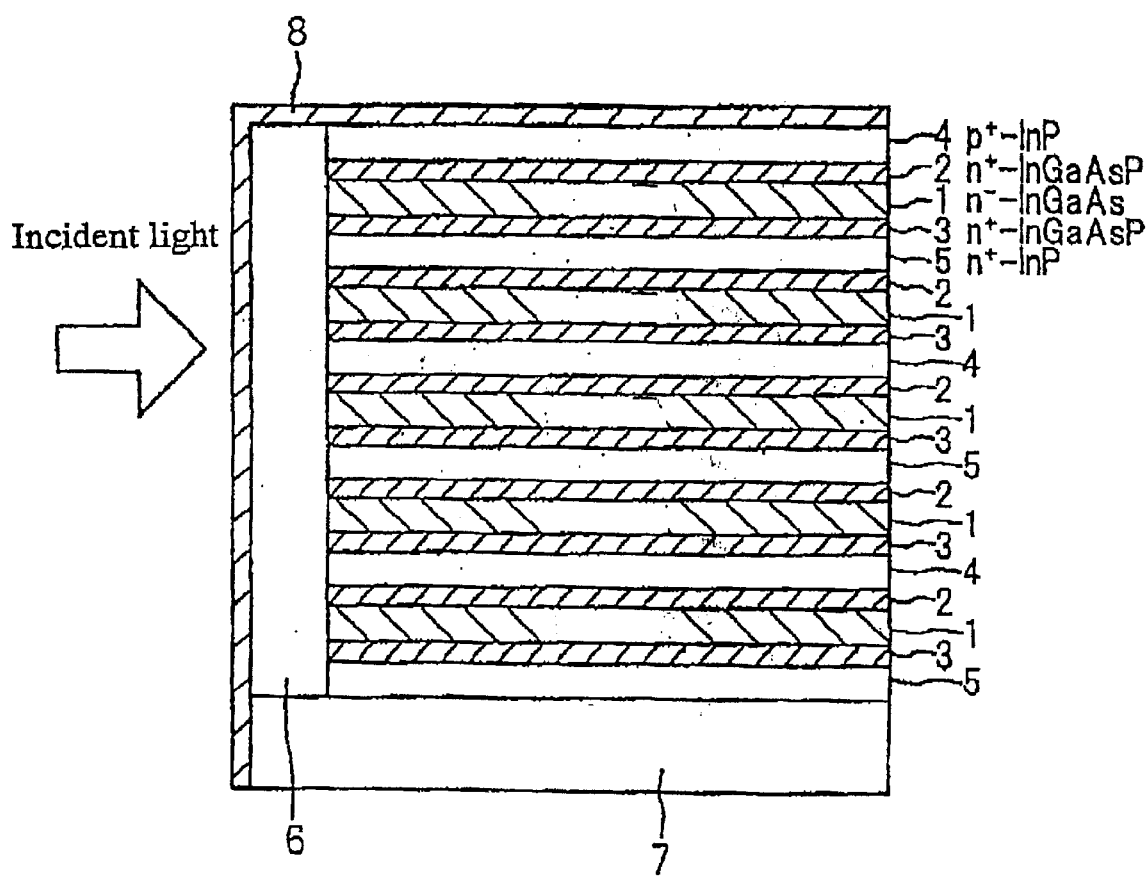
FIG. 2B is a cross sectional elevation view illustrative of a novel semiconductor photodetector shown in FIG. 2A in a first embodiment in accordance with the present invention.

A first embodiment according to the present invention will be described in detail with reference to the drawings. FIG. 2A is a schematic perspective view illustrative of a novel semiconductor photodetector in a first embodiment in accordance with the present invention. FIG. 2B is a cross sectional elevation view illustrative of a novel semiconductor photodetector shown in FIG. 2A in a first embodiment in accordance with the present invention.

The novel semiconductor photodetector is provided over a semi-insulating InP substrate 7. An optical waveguide structure is provided over the semi-insulating InP substrate 7. The optical waveguide structure comprises five periods of the following multi-layered structure. An n+-InP layer 5 is provided on the semi-insulating InP substrate 7, wherein the n+-InP layer 5 has an impurity concentration of $1E16/cm^3$ and a thickness of 0.1 micrometer. An n+-InGaAsP cladding layer 3 is provided on the n+-InP layer 5, wherein the n+-InGaAsP cladding layer 3 has an impurity concentration of $1E16/cm^3$ and a thickness of 0.03 micrometer. An n--InGaAs optical absorption layer 1 is provided on the n+-InGaAsP cladding layer 3, wherein the n--InGaAs optical absorption layer 1 has an impurity concentration of $1E15/cm^3$ and a thickness of 0.2 micrometer. An n+-InGaAsP cladding layer 2 is provided on the n--InGaAs optical absorption layer 1, wherein the n+-InGaAsP cladding layer 2 has an impurity concentration of $1E16/cm^3$ and a thickness of 0.03 micrometer. A p+-InP layer 4 is provided on the n+-InGaAsP cladding layer 2, wherein the p+-InP layer 4 has an impurity concentration of $1E16/cm^3$ and a thickness of 0.1 micrometer. The n+-InGaAsP cladding layer 3 is provided on the p+-InP layer 4, wherein the n+-InGaAsP cladding layer 3 has an impurity concentration of $1E16/cm^3$ and a thickness of 0.03 micrometer. The n--InGaAs optical absorption layer 1 is provided on the n+-InGaAsP cladding layer 3, wherein the n--InGaAs optical absorption layer 1 has an impurity concentration of $1E15/cm^3$ and a thickness of 0.2 micrometer. The n+-InGaAsP cladding layer 2 is provided on the n--InGaAs optical absorption layer 1, wherein the n+-InGaAsP cladding layer 2 has an impurity concentration of $1E16/cm^3$ and a thickness of 0.03 micrometer.

An n+-InP layer 6 is provided on a facet of the optical waveguide structure, wherein the n+-InP layer 6 has an impurity concentration of $1E16/cm^3$ and a thickness of 0.1 micrometer. An SiNx passivation layer 8 is provided which extends on the n+-InP layer 6 and the surface of the optical waveguide structure. The SiNx passivation layer 8 has a first opening, in which a p-electrode 9 is provided which is in contact with the p+-InP layer 4. The SiNx passivation layer 8 also has a second opening, in which an n-electrode 10 is provided which is in contact with the n+-InP layer 5.

The n--InGaAs optical absorption layer 1 is thin. The n--InGaAs optical absorption layer 1 has a low impurity concentration. This means that a carrier traveling distance through the low impurity semiconductor region is short. Further, the p+-InP layer 4 and the n+-InP layer 5 sandwich the n+-InGaAsP cladding layer 2 and the n+-InGaAsP cladding layer 3 which further sandwich the thin n--InGaAs optical absorption layer 1. This sandwich structure allows that application of a low voltage, for example, not higher than 1 volt causes a space charge region in the n--InGaAs optical absorption layer 1. The above two characteristics allow the semiconductor photodetector having the above novel structure to exhibit the high speed response.

Moreover, the p+-InP layer 4 and the n+-InP layer 5 sandwich the n+-InGaAsP cladding layer 2 and the n+-InGaAsP cladding layer 3 which further sandwich the thin n--InGaAs optical absorption layer 1. This sandwich structure enlarges an effective area or an effective thickness of the absorption region of the optical waveguide structure even the carrier traveling distance through the low impurity semiconductor region is short. Further, the n+-InGaAsP cladding layer 2 and the n+-InGaAsP cladding layer 3 have the same conductivity type. This improves the coupling efficiency to the incident light from the optical fiber.

The n+-InP layer 6 protects the p-n junction structure of the above multi-layered structure to ensure a high reliability and a stable dark current characteristic of the semiconductor photodetector.

The optical waveguide structure comprises the five periods of the multi-layered structure. This structure enlarges an effective area or an effective thickness of the absorption region of the optical waveguide structure even the carrier traveling distance through the low impurity semiconductor region is short. Further, the n+-InGaAsP cladding layer 2 and the n+-InGaAsP cladding layer 3 have the same conductivity type. This improves the coupling efficiency to the incident light from the optical fiber.

The novel semiconductor photodetector exhibits a high speed response at about 20 GHz and having a high external quantum efficiency of not less than 90%. The novel semiconductor photodetector is also operable at a low voltage of not more than 1 volt and having a high reliability and a stable dark current characteristic.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An optical waveguide structure comprising plural multi-layered structures that directly contact each other, each of said multi-layered structures comprising:
   an InGaAs optical absorption layer of a first conductivity type, a pair of first and second InGaAsP cladding layers of said first conductivity type sandwiching and directly contacting said InGaAs optical absorption layer, and a pair of a first InP layer of said first conductivity type and a second InP layer of a second conductivity type, and said first and second InP layers sandwiching and directly contacting respective ones of said first and second InGaAsP cladding layers.

2. The optical waveguide structure as claimed in claim 1, wherein said optical waveguide structure has at least a facet coated with an n-InP layer.

3. The optical waveguide structure as claimed in claim 1, wherein said InGaAs optical absorption layer has a thickness in the range of 0.15 micrometers to 0.25 micrometers.

4. The optical waveguide structure as claimed in claim 1, comprising 5–20 of said multi-layer structures.

5. The optical waveguide structure as claimed in claim 1, wherein each of said first and second InP layers is common to adjacent two of said multi-layered structure.

6. The optical waveguide structure of claim 1, further comprising an In substrate and wherein said multi-layered structures are on a surface of said substrate and said layers of said multi-layered structures are parallel to said surface.

7. An optical waveguide structure comprising a sequential laminated structure of an $n^+$-InP layer that directly contacts an $n^-$-InGaAsP cladding layer that directly contacts an $n^+$-InGaAs optical absorption layer that directly contacts an $n^+$-InGaAsP cladding layer that directly contacts a $p^+$-InP layer that directly contacts an $n^+$-InGaAsP cladding layer that directly contacts an $n^-$-InGaAs optical absorption layer that directly contacts an $n^+$-InGaAsP cladding layer.

8. The optical waveguide structure of claim 7, further comprising an In substrate and wherein said sequential laminated structure is on a surface of said substrate and said layers of said sequential laminated structure are parallel to said surface.

9. An optical waveguide structure comprising:
a plurality of InP layers in which n-type InP layers and p-type InP layers are alternately placed; and
plural multi-layered structures, each of which includes an InGaAs absorption layer sandwiched between and directly contacting InGaAsP cladding layers,
wherein one of said multi-layered structures is between and directly contacting each pair of one of said n-type InP layers and one of p-type InP layers.

10. The optical waveguide structure of claim 9, further comprising an In substrate and wherein said multi-layered structures are on a surface of said substrate and said layers of said multi-layered structures are parallel to said surface.

11. An optical waveguide structure comprising:
first and second multilayer structures that each have an InGaAs optical absorption layer of a first conductivity type between and directly contacting a pair of InGaAsP cladding layers of the first conductivity type, and a pair of InP layers that sandwich and directly contact said pair of cladding layers, where one of said InP layers is the first conductivity type and another said InP layers is a second conductivity type,
wherein said second multilayer structure is directly adjacent to said first multilayer structure and the one of the InP layers that is between said first and second multilayer structures is common to both said first and second multilayer structures.

12. The optical waveguide structure of claim 11, further comprising third and fourth multilayered structures that are the same as said first and second multilayer structures, and wherein said third and fourth multilayered structures and said first and second multilayered structures share one of the InP layers.

13. The optical waveguide structure of claim 11, further comprising an In substrate and wherein said first and second multilayered structures are on a surface of said substrate and said layers of said multilayered structures are parallel to said surface.

* * * * *